United States Patent [19]

Posse

[11] Patent Number: 5,260,947
[45] Date of Patent: Nov. 9, 1993

[54] BOUNDARY-SCAN TEST METHOD AND APPARATUS FOR DIAGNOSING FAULTS IN A DEVICE UNDER TEST

[75] Inventor: Kenneth E. Posse, Ft. Collins, Colo.

[73] Assignee: Hewlett-Packard Company, Palo Alto, Calif.

[21] Appl. No.: 623,877

[22] Filed: Dec. 4, 1990

[51] Int. Cl.⁵ .................. G01R 31/28; G06F 11/00
[52] U.S. Cl. .................................... 371/22.3; 371/15.1
[58] Field of Search .............. 371/22.3, 15.1, 22.1, 371/22.4, 22.5, 22.6

[56] References Cited

U.S. PATENT DOCUMENTS

| | | | |
|---|---|---|---|
| 4,354,268 | 10/1982 | Michel et al. | 371/15.1 |
| 4,760,330 | 7/1988 | Lias, Jr. | 371/15.1 |
| 4,801,870 | 1/1989 | Eichelberger et al. | 371/22.3 |
| 5,005,173 | 4/1991 | Martin | 371/15.1 |
| 5,023,875 | 6/1991 | Lee et al. | 371/22.3 |
| 5,101,150 | 3/1992 | Sullivan et al. | 371/15.1 |
| 5,130,646 | 7/1992 | Kojima | 371/22.3 |
| 5,150,048 | 9/1992 | McAuliffe et al. | 371/15.1 |

FOREIGN PATENT DOCUMENTS 1-98979  4/1989  Japan .................. 371/22.3

Primary Examiner—Hoa T. Nguyen

[57] ABSTRACT

An apparatus for diagnosing faults in a device equipped with boundary-scan test capability stores serial test data upon detection of a fault in a device under test (DUT). Test data corresponding to a frame vector associated with the fault is formatted so that all information from parallel tester inputs and TAP scan registers can be simultaneously analyzed. A method for diagnosing faults is also disclosed.

24 Claims, 3 Drawing Sheets

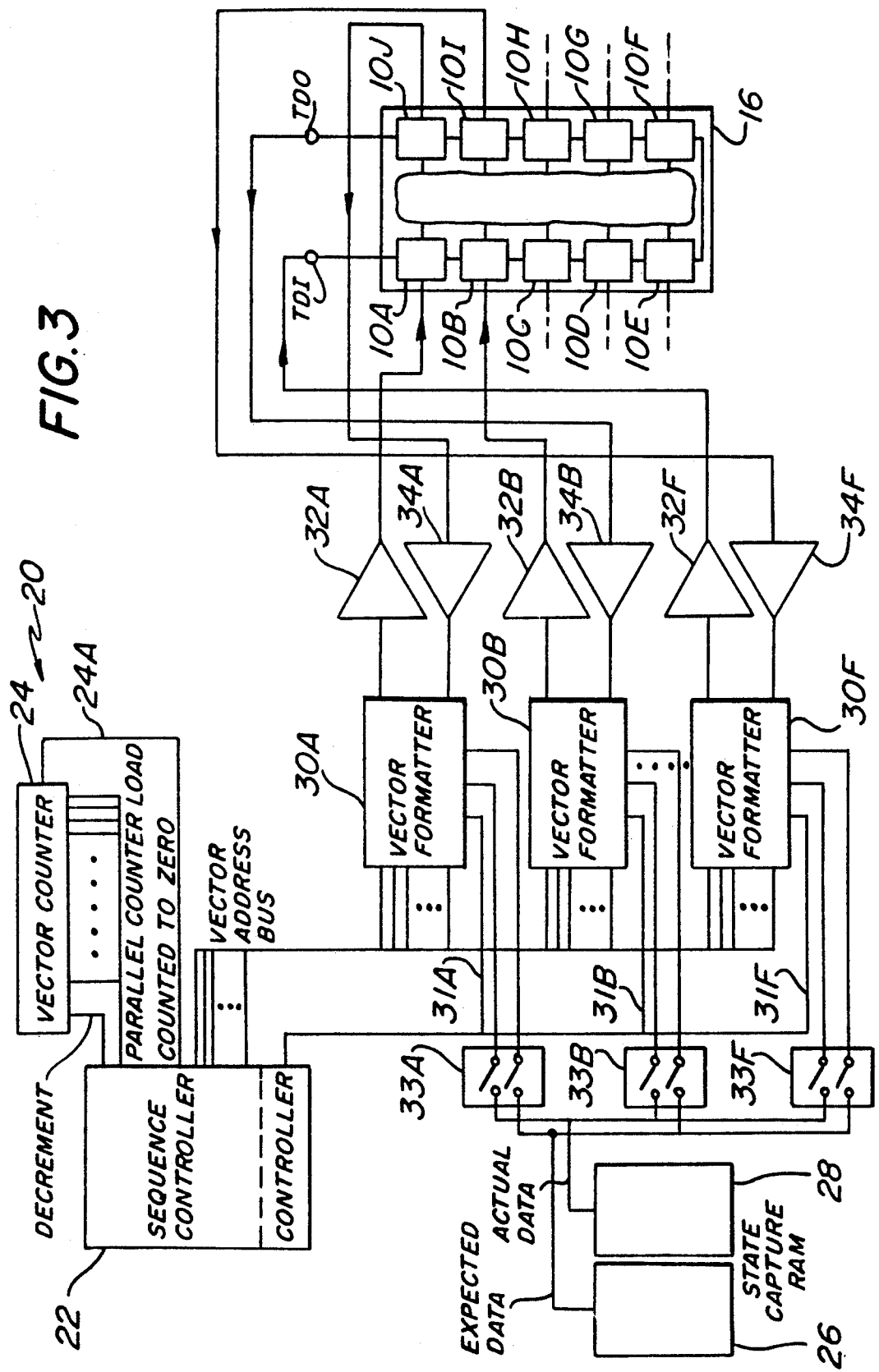

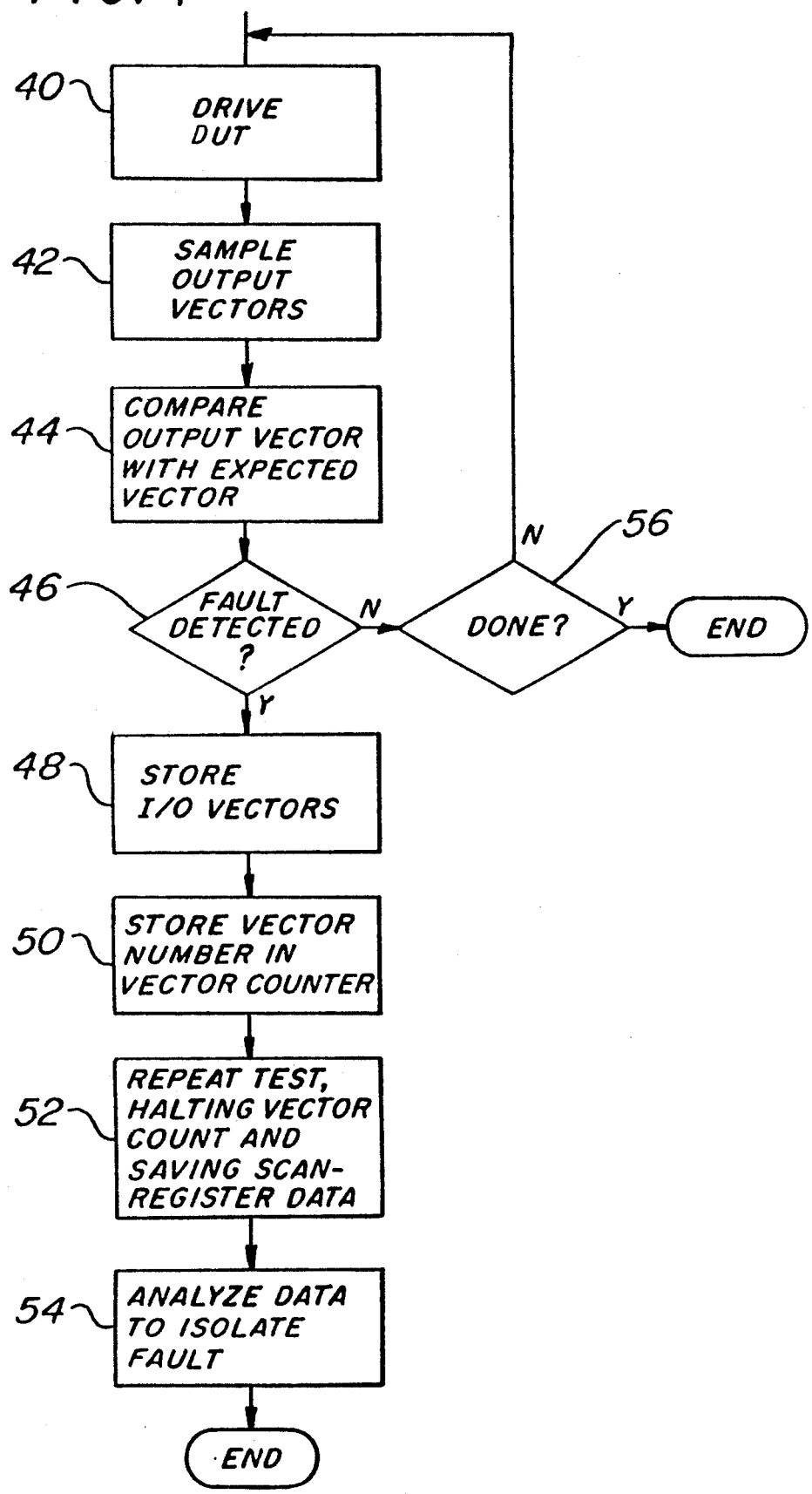

BOUNDARY-SCAN TEST METHOD AND APPARATUS FOR DIAGNOSING FAULTS IN A DEVICE UNDER TEST

FIELD OF THE INVENTION

The present invention relates generally to methods and apparatuses for performing in-circuit testing of digital components. More particularly, the invention is related to a method and apparatus for diagnosing faults in a device having boundary-scan test capability.

BACKGROUND OF THE INVENTION

In-circuit testing is used to test integrated circuit devices to ensure, among other things, that the various components of a particular device under test (DUT) are properly interconnected. In addition, in-circuit testing techniques are used to ensure that the various integrated circuit devices mounted together on a common circuit board are properly interconnected. The primary advantage of in-circuit testing is that the DUT can be tested without physically disconnecting it from its surrounding circuitry. This translates into significant savings in both time and cost.

The Institute of Electrical and Electronic Engineers (IEEE) boundary-scan standard specifies test logic that can be incorporated into an integrated circuit device to provide standardized approaches to testing the device using in-circuit testing techniques. See IEEE standard 1149.1. This standard is fully described in the document entitled "IEEE Standard Test Access Port and Boundary-Scan Architecture," published by the IEEE, which is incorporated herein by reference. The boundary-scan technique involves the inclusion of a shift-register stage (contained in a boundary-scan cell) adjacent to each component pin so that signals at component boundaries can be controlled and observed using scan testing principles.

FIG. 1 illustrates an exemplary implementation for a boundary-scan cell 10 that could be used for an input or output terminal of an integrated circuit. Depending upon the control signals "M" and "S/L", applied to the multiplexers 12A, 12B, data can either be loaded into the scan register from the "SI" port, or driven from the register through the "SO" port of the cell into the core integrated circuit of the component. The operation of this boundary-scan cell is more fully described in the above-referenced IEEE standard document.

FIG. 2 illustrates how a number of boundary-scan cells 10A, 10B, 10C, etc., may be interconnected to each other and to a core integrated circuit 18, to form a "boundary-scan device" 16, i.e., a device equipped with boundary-scan test capability, as defined by the above-referenced IEEE standard. As shown in FIG. 2, the boundary-scan cells for the pins of a component 16 are interconnected so as to form a shift-register chain around the border of the integrated circuit 18, and this chain is provided with serial input and output connections "TDI", "TDO" and appropriate clock and control signals (not shown).

To allow the components to be tested, the boundary-scan register can be used as a means of isolating on-chip system logic from stimuli received from surrounding components while an internal self-test is performed. Alternatively, if the boundary-scan register is suitably designed, it can permit a limited slow-speed status test of the on-chip system logic since it allows delivery of test data to the component and examination of the test results.

Note also that by parallel loading the cells at both the inputs and outputs of a component and shifting out the results, the boundary-scan register provides a means of observing the data flowing into the component through its input pins and a means of delivering data from the component through its output pins. This mode of operation is valuable for fault diagnosis since it permits examination of connections not normally accessible to the test system, e.g., the connection (i.e., trace) between an external input terminal 11A of the device and an input 18A to the core integrated circuit 18.

The precise sequence of signals that needs to be input to these TAP (Test Access Port) inputs is unimportant as far as the present invention is concerned. It is important to note, however, that during various types of testing it is often necessary to drive and receive data to/from both the parallel inputs to these shift registers and to/from the TDI/TDO terminals. For example, as alluded to above, this is necessary during an important test called a connect test, i.e., a verification that all of the internal input and output terminals of the chip are properly connected to the board.

In order to perform the connect test, certain signals must be presented to the board nets via test drivers, certain signals must be received from the board via test receivers, certain signals must be driven to TDI and the various control ports of the scan cells 10A, 10B, etc., from test drivers, and certain signals must be received via TDO by the test receivers. A problem with this testing procedure is that data from all of the test receivers is strobed in at the same time. This parallel input is called an "input vector" and it represents a sample of activity from some group of board nets at a particular point in time. Now, in order to detect and diagnose a fault in the device, it is necessary to analyze all of the data from a given point in time at once. If a failure is detected at some point, the test is halted and the failure analysis printed.

However, in the case of a boundary scan device, while the parallel data inputs to a device may all be sampled at the same time as the parallel tester inputs (i.e. the data outputs of the device), the input data to the core integrated circuit 18, sampled by the scan cells, is not available to the tester until additional control vectors have been input to the TAP to shift out this information. Therefore, if a fault is detected at some tester input, the information necessary for a complete fault analysis is not available at that time. The data captured by the respective scan cells must be clocked out and this serialized data lined up with the appropriate parallel data taken from the tester inputs. This is difficult to do with known test receivers since they are not designed to store serial data.

Accordingly, the object of the present invention is to provide a method and apparatus by which a test comparator (receiver) can be connected to a storage-device and this data then re-formatted so that all information from both the parallel tester inputs and the boundary-scan cells may be simultaneously analyzed to isolate faults in the DUT.

SUMMARY OF THE INVENTION

The present invention provides a boundary-scan tester for diagnosing faults in a DUT having boundary-scan test capability. An embodiment of the invention includes a driver/receiver head for driving the input terminals of the DUT with a parallel input vector and receiving a corresponding parallel output vector from the output terminals of the DUT. Further, the tester includes means for comparing the received output vector with its expected value and providing a failure signal when the actual vector is not equal to the expected vector. A sequence controller, comparing means, receives the failure signal and in response thereto transmits control signals to the DUT via the driver/receiver head. The control signals cause actual data captured by boundary-scan cells associated with the respective input and output terminals of the DUT to be serially shifted out to the driver/receiver. A state capture RAM, coupled to the driver/receiver, stores the input/output vectors and serial boundary-scan cell data. The stored data is thereby made available for analysis to isolate the fault.

In a most preferred embodiment of the invention, the tester further includes means for driving input terminals of the DUT with a series of parallel input vectors and, upon detection of a fault, computing a vector number identifying the particular input and output vectors present on the terminals of the DUT at the time the fault was detected. In addition, a most preferred embodiment further includes means for repeating a boundary-scan test, upon the detection of a fault, up to the same input vector present at the time the fault was detected, and means for providing the comparing means with the expected output vector.

An alternative embodiment of the invention provides a method, which can be carried out by the above apparatuses, for diagnosing a fault in a DUT having boundary-scan test capability. This method comprises the steps of driving input terminals of the DUT with a sequence of vector frames and receiving output data from output terminals of the DUT, comparing the output data with expected output data and determining whether a fault exists, and, if a fault is detected, storing portions of the input and/or output data and performing the following steps: repeating the test up to the end of the vector frame by which the fault was detected, storing portions of the output data from that frame, and analyzing the stored input and output data to isolate the fault. The preferred embodiment includes additional steps, which are described below.

BRIEF DESCRIPTION OF THE DRAWINGS

FIG. 3 is a block diagram of a boundary-scan tester in accordance with the present invention.

FIG. 4 is a flowchart of a method of diagnosing faults in a device under test having boundary-scan test capability, in accordance with the present invention.

DETAILED DESCRIPTION OF THE PREFERRED EMBODIMENTS

Figure 1:
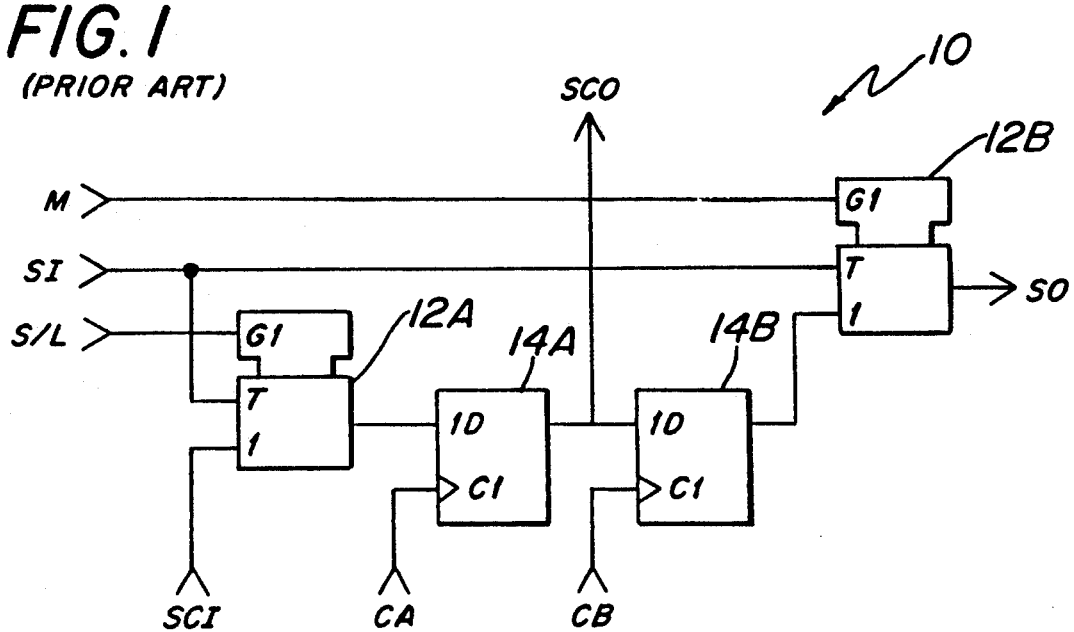
FIG. 1 is a block diagram of a known boundary-scan cell.
Figure 2:
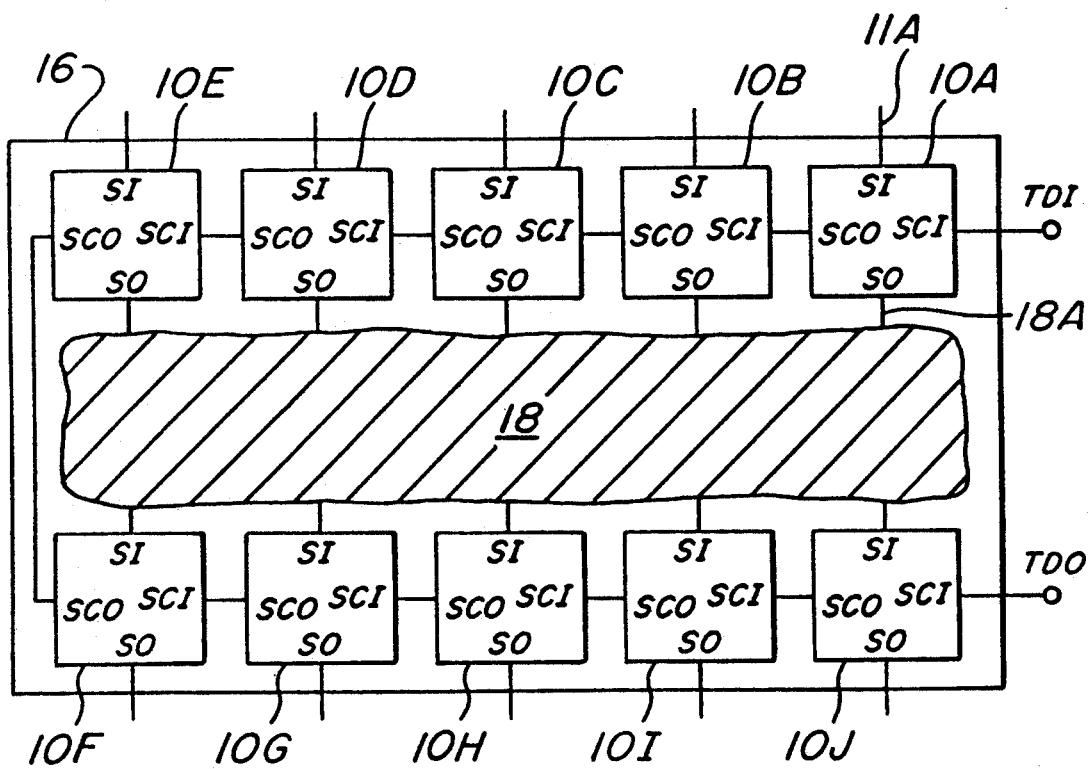
FIG. 2 is a block diagram of a known device having boundary-scan test capability.

Preferred embodiments of the invention will now be described with reference to FIGS. 3 and 4, wherein like numerals represent like elements or steps.

Referring now to FIG. 3, a boundary-scan tester 20 for diagnosing faults in a device under test (DUT) 16 comprises a microcomputer controller coupled with memory elements and program code, together composing the "sequence controller" 22 illustrated in the drawing. The sequence controller 22 is programmed to output a series of vector addresses to a group of test head drivers and receivers, each of which comprises a vector formatter 30A through 30F, an associated driver 32A through 32F, and an associated receiver 34A through 34F. (Note that the number of test head drivers in the group will vary in accordance with the number of DUT input/output terminals to be tested.) In addition, a "vector counter" register 24 is provided. The vector counter may be preloaded with an integer value from the sequence controller 22, and may thereafter be decremented to zero. Upon reaching zero, the vector counter 24 outputs a signal over line 24A. This enables the sequence controller 22 to be programmed to halt the outputting of vectors after a given number of vectors has been output, as described more fully below. Also as described more fully below, the sequence controller 22 can be programmed to provide expected data to the vector formatters 30A through 30F for performing fault detection.

The vector formatters 30A, 30B, etc., include means for comparing vectors received from the output terminals 10F, 10G, 10H, 10I, 10J of the DUT, via the receivers 34A, 34B, etc., with corresponding expected vectors provided by the sequence controller, and providing a pass/fail signal, indicating when a failure is detected, to the sequence controller over the respective or-tied lines 31A through 31F. As mentioned above, the sequence controller 22 can be programmed to either halt on receiving the failure signal or to ignore it.

Finally, memory denoted "state capture RAM" 26, 28 is controllably coupled to the vector formatters 30A, 30B, etc., via switching means 33A through 33F such that the actual data received from the DUT and corresponding expected data can be stored for later analysis. Coupling of the state capture RAM 26, 28 to the vector formatters 30A, 30B, etc., is controlled by the respective vector formatters in response to control signals from the sequence controller 22. In a preferred embodiment, data stored in the state capture RAM 26, 28 begins at address zero and continues up to the size of the RAM, after which it cycles back to address zero, overlaying previously stored data. In a most preferred embodiment, expected data is stored in a first block of memory 26, and actual data is stored in a second block of memory 28. The switching means 33A through 33F are each preferably controllable switches available from Hewlett-Packard Company, Palo Alto, Calif., as part number HP 0490-1688. Drivers 32A through 32F and receivers 34A through 34F are each preferably hybrid driver/receivers available from Hewlett-Packard Company as part number HP 03066-66561. Vector formatters 30A through 3OF are each preferably format chips available from Hewlett-Packard Company as part number HP 1SG80076.

Referring now to FIG. 4, a method of diagnosing faults in a device equipped with boundary-scan test capability includes the following steps:

First, a series of input vectors are presented to the input terminals of the DUT 16, step 40, and a corresponding series of output vectors is received from the output terminals, step 42. This series of I/O vectors comprises a number of "frame vectors", each of which includes a combined I/O vector transmitted to and received from the DUT 16 at a particular instant of time, and a series of vectors designed to scan in to an out from the boundary-scan cells 10A, 10B, etc. This serial data is scanned in to the TDI port and out of the TDO port of the DUT and received by receiver 34F, as shown in FIG. 3. Note that the boundary-scan cell information is scanned out without altering the parallel input/output vectors to/from the terminals of the DUT 16. A frame vector is therefore composed of N*Y+X parallel vectors, where "N" is the number of boundary-scan cells 10A, 10B, etc., in the DUT, "Y" is the number of vectors required to shift data one position in the chain of boundary-scan cells and "X" is the number of vectors required to cause the test access port controller to latch the parallel outputs and receive the parallel inputs. Typically, Y will be 1, but is not limited thereto.

Next, for each I/O vector in the series, the received output vector is compared with an expected vector based upon the corresponding input vector, step 44. If a fault is detected, i.e., if there is a difference between either received vector and its corresponding expected value, as determined at step 46, step 48 is executed. If no fault is detected, a determination is made of whether the test is complete, step 56, and if not, the test continues with successive vectors in the series.

If a fault is detected, the test is halted (i.e., the sequence controller is halted) and the I/O vector by which the fault was detected is stored in memory associated with the sequence controller, step 48.

Next, the vector number corresponding to the last vector in the vector frame where the fault occurred is stored in vector counter 24, step 50. The sequence controller is then set to ignore the pass/fail signal and halt on the vector counter 24 being decremented to zero.

The test sequence is repeated and all data associated with the frame vector by which the fault was detected is saved in the state capture RAM 26, 28, step 52.

The stored data is then analyzed to isolate the fault, step 54. In the analysis, the state capture RAM is read and the last N*Y+X vectors (the data from the failing frame vector) are examined for differences between the actual and expected data. Any differences can be correlated with a fault associated with a particular boundary-scan cell, and therefore a particular position, in the DUT.

Finally, it is noted that the invention is not intended to be limited to the preferred embodiments discussed above. For example, the drivers, receivers, switches, etc., described may be embodied in various devices capable of performing equivalent functions, within the context of the invention, to those described. In addition, it is not necessary that all of the data in the stored vector frames be saved, since some of the data is of no use in the fault isolation analysis. Accordingly, reference should be made to the following claims for determining the true scope of the invention.

What is claimed is:

1. A boundary-scan tester for diagnosing a fault in a device under test (DUT), the DUT having boundary-scan cells coupled to respective input and output terminals thereof, comprising:
    (a) driver/receiver means for driving input terminals of the DUT with a parallel input vector and receiving a corresponding parallel output vector from output terminals of the DUT;
    (b) comparing means, coupled to said driver/receiver means, for comparing said output vector with an expected output vector and providing a failure signal indicative of the result thereof and defining a fault;
    (c) first control means, coupled to said driver/receiver means and said comparing means, for receiving said failure signal from said comparing means and in response thereto transmitting control signals to the DUT via said driver/receiver means, said control signals causing data captured by boundary-scan cells associated with the respective input and output terminals of the DUT to be serially shifted out to said driver/receiver means; and
    (d) storage means, coupled to said driver/receiver means, for storing said input and output vectors and the data shifted out of said boundary-scan cells, the stored data being analyzable to isolate the fault.

2. A boundary-scan tester as recited in claim 1, further comprising:
    (e) computing means for driving input terminals of the DUT with a series of parallel input vectors and, upon a fault being indicated by said failure signal, computing a vector number identifying the particular input and output vectors present on the terminals of the DUT.

3. A boundary-scan tester as recited in claim 2, wherein said control means further repeats a boundary-scan test, upon a fault being indicated by said failure signal, up to the last vector in the vector frame present when said fault was indicated.

4. A boundary-scan tester as recited in claim 1, further comprising:
    (e) second control means, coupled to said comparing means, for providing said comparing means with said expected output vector.

5. A boundary-scan tester as recited in claim 1, wherein said control means comprises a microprocessor.

6. A boundary-scan tester as recited in claim 1, wherein said storage means comprises a RAM.

7. A boundary-scan tester as recited in claim 1, wherein said driver/receiver means comprises a vector formatter, a driver and receiver.

8. A boundary-scan tester as recited in claim 7, wherein said vector formatter comprises a Hewlett Packard part number HP 1SG80076 format chip.

9. A boundary-scan tester as recited in claim 7, wherein said driver comprises a Hewlett Packard part number HP 03066-66561 driver/receiver hybrid.

10. A boundary-scan tester as recited in claim 7, wherein said receiver comprises a Hewlett Packard part number HP 03066-66561 driver/receiver hybrid.

11. A boundary-scan tester for diagnosing a fault in a device under test (DUT), the DUT having boundary-scan cells coupled to respective input and output terminals thereof, comprising:
    (a) driver/receiver means for driving input terminals of the DUT with a parallel input vector and receiving a parallel output vector from output terminals of the DUT;
    (b) comparing means, coupled to said driver/receiver means, for comparing said output vector with an expected output vector and providing a failure signal indicative of the result thereof and defining a fault;
    (c) first control means, coupled to said driver/receiver means and said comparing means, for receiving said failure signal from said comparing means and in response thereto transmitting control signals to the DUT via said driver/receiver means, said control signals causing data captured by boundary-scan cells associated with the respective input and output terminals of the DUT to be serially shifted out to said driver/receiver means;

(d) storage means, coupled to said driver/receiver means, for storing said input and output vectors and the data shifted out of said boundary-scan cells, the stored data being analyzable to isolate the fault;

(e) computing means for driving input terminals of the DUT with a series of parallel input vectors and, upon a fault being indicated by said failure signal, computing a vector number identifying the last vector in a vector frame present on the terminals of the DUT;

(f) repeating means, coupled to said control means, for repeating a boundary-scan test, upon a fault being indicated by said failure signal, up to the last vector in a vector frame present when said fault was indicated; and (g) second control means, coupled to said comparing means, for providing said comparing means with said expected output vector.

12. A boundary-scan tester as recited in claim 11, wherein said control means comprises a microprocessor.

13. A boundary-scan tester as recited in claim 11, wherein said storage means comprises a RAM.

14. A boundary-scan tester as recited in claim 11, wherein said driver/receiver means comprises a vector formatter, a driver and receiver.

15. A boundary-scan tester as recited in claim 14, wherein said vector formatter comprises a Hewlett Packard part number HP 1SG80076 format chip.

16. A boundary-scan tester as recited in claim 14, wherein said driver comprises a Hewlett Packard part number HP 03066-66561 driver/receiver hybrid.

17. A boundary-scan tester as recited in claim 14, wherein said receiver comprises a Hewlett Packard part number HP 03066-66561 driver/receiver hybrid.

18. A boundary-scan tester for diagnosing a fault in a device under test (DUT), the DUT having boundary-scan cells coupled to respective input and output terminals thereof, comprising:

(a) driver/receiver means, comprises a vector formatter, a driver and receiver, for driving input terminals of the DUT with a parallel input vector and receiving a parallel output vector from output terminals of the DUT, said vector formatter comprising a Hewlett Packard part number HP 1SG80076 format chip, and including means for comparing said output vector with an expected output vector and providing a failure signal indicative of the result thereof, said driver and receiver comprising a Hewlett Packard part number HP 03066-66561 driver/receiver hybrid;

(b) control means, coupled to said driver/receiver means, for receiving said failure signal and in response thereto transmitting control signals to the DUT via said driver/receiver means, said control signals causing data captured by boundary-scan cells associated with the respective input and output terminals of the DUT to be serially shifted out to said driver/receiver means, said control means comprising a microprocessor and means for providing said comparing means with said expected output vector;

(c) storing means comprising a RAM, coupled to said driver/receiver means, for storing said input and output vectors and said serial boundary-scan cell data, wherein the stored data may be analyzed to isolate the fault;

(d) computing means for driving input terminals of the DUT with a series of parallel input vectors and, in response to said failure signal indicating a fault, computing a vector number identifying a last vector in a vector frame present on the terminals of the DUT; and (e) repeating means, coupled to said control means, for repeating a boundary-scan test, upon a fault being indicated by said failure signal, up to the last vector in the vector frame present when the fault was indicated.

19. A method of diagnosing a fault in a device under test (DUT), the DUT having boundary-scan cells coupled to respective input and output terminals thereof, comprising the steps of:

(a) driving input terminals of the DUT with an input vector and receiving an output vector from output terminals of the DUT;

(b) comparing said output vector with an expected output vector and determining whether a fault exists in the DUT, and, if a fault is determined to exist, then storing said input and output vectors and performing the following steps;

(c) shifting out data captured by boundary-scan cells associated with the respective input and output terminals of the DUT without changing said input and output vectors;

(d) storing the data shifted out of the boundary-scan cells and expected boundary-scan cell data; and (e) analyzing said input and output vectors, said data shifted out of the boundary-scan cells, and said expected boundary-scan cell data to isolate said fault.

20. A method of diagnosing a fault in a DUT as recited in claim 19, further comprising the step of computing, upon detection of a fault, a vector number identifying the last vector in a vector frame present on the terminals of the DUT at the time the fault was detected.

21. A method of diagnosing a fault in a DUT as recited in claim 19, further comprising the step of repeating the boundary-scan test, upon the detection of a fault, up to the last vector in a vector frame present at the time the fault was detected.

22. A method of diagnosing a fault in a DUT as recited in claim 19, further comprising the step of determining said expected output vector prior to performing step (b).

23. A method of diagnosing a fault in a DUT as recited in claim 19, further comprising the steps of:

(i) computing, upon detection of a fault, a vector number identifying the last vector in a vector frame present on the terminals of the DUT at the time the fault was detected;

(ii) repeating the boundary-scan test, upon the detection of a fault, up to the last vector in the vector frame present at the time the fault was detected; and (iii) determining said expected output vector prior to performing step (b).

24. A method of diagnosing a fault in a device under test (DUT), the DUT having boundary-scan cells coupled to respective input and output terminals thereof, comprising the steps of:

(a) driving input terminals of the DUT with a sequence of vector frames and receiving corresponding output data from output terminals of the DUT;

(b) comparing the output data with expected output data and determining whether a fault exists, and, if a fault is determined to exist, performing the following steps:
(c) storing portions of the frame vector sequence and output data; and
(d) repeating the test up to the end of the vector frame by which the fault was detected, storing portions of the output data corresponding to that frame, and analyzing the stored data to isolate the fault.

* * * * *